United States Patent [19]
Küssel

[11] Patent Number: 5,742,795
[45] Date of Patent: Apr. 21, 1998

[54] METHOD OF INITIALIZING AND UPDATING A NETWORK MODEL

[75] Inventor: Reinhard Küssel, Schriesheim, Germany

[73] Assignee: ABB Patent GmbH, Mannheim, Germany

[21] Appl. No.: 567,097

[22] Filed: Dec. 4, 1995

[30] Foreign Application Priority Data

Dec. 2, 1994 [DE] Germany ............... 44 42 963.0

[51] Int. Cl.$^6$ ............................................. G06F 7/52
[52] U.S. Cl. .......................... 395/500; 364/492; 364/578
[58] Field of Search .................. 395/500; 364/492, 364/578, 229

[56] References Cited

U.S. PATENT DOCUMENTS 4,787,057 11/1988 Hammond ......................... 364/754

*Primary Examiner*—Kevin J. Teska
*Assistant Examiner*—A. S. Roberts

*Attorney, Agent, or Firm*—Herbert L. Lerner; Laurence A. Greenberg

[57] ABSTRACT

A method for initializing and updating a network model includes forming a network topology in the form of a network graph and basing it on the object of specifying a method which can be realized by a computer program that can be processed with a short computing time. Such methods are used, for example, in network master computers of an electrical power supply network, with the network topology established being the basis for indications or calculations. In the method according to the invention, the network topology is formed by applying and expanding sparse vector methods and sparse matrix methods by the following steps: providing captured networked topology data in the form of a terminal adjacence matrix, transforming the matrix into an upper triangular matrix, initializing the upper triangular matrix, forming the matrix products for rows of the upper triangular matrix, forming a path table from the upper triangular matrix, updating the upper triangular matrix in the case of a change to the captured network topology data, updating the path table and identifying components of the network graph using the path table.

4 Claims, 19 Drawing Sheets

|   | 1 | 2 | 3 | 4 | 5 | 6 | 7 | 8 | 9 |
|---|---|---|---|---|---|---|---|---|---|
| 1 | • |   |   |   | G |   |   | D |   |
| 2 |   | • |   |   |   | c | b | A |   |
| 3 |   |   | • |   |   |   | I |   | O |
| 4 |   |   |   | • | n | m |   |   | P |
| 5 | G |   |   |   | • | K |   | f | Δ |
| 6 |   |   |   |   |   | • | H | e | l |
| 7 |   |   |   |   |   |   | • | Δ | j |
| 8 | D |   |   |   |   |   |   | • | Δ |
| 9 |   |   |   |   |   |   |   |   | • |

Fig. 8

| | 1 | 2 | 3 | 4 | 5 | 6 | 7 | 8 | 9 |
|---|---|---|---|---|---|---|---|---|---|
| 1 | • | | | | | | | | |
| 2 | | ○ | | | | | | D | |
| 3 | | | ○ | | | c | b | A | O |
| 4 | | | | ○ | n | | I | | P |
| 5 | G | | | | | m | | | △ |
| 6 | | | | | | K | | f | l |
| 7 | | | | | ○ | ○ | H | e | j |
| 8 | | | | | | | ○ | △ | △ |
| 9 | | | | | | | | ● | ○ |

↑ Branch status

[ ]

| | 1 | 2 | 3 | 4 | 5 | 6 | 7 | 8 | 9 |
|---|---|---|---|---|---|---|---|---|---|
| 1 | 1 | | | | | | | | |
| 2 | | 1 | | | | | | -128 | |
| 3 | | | 1 | | | | | -128 | -128 |
| 4 | | | | 1 | | | | | |
| 5 | | | | | -128 | 0 | 0 | | 0 |
| 6 | | | | | 0 | 0 | -128 | | 0 |
| 7 | | | | | 2 | -128 | | 1 | 1 |
| 8 | | | | | | 2 | 3 | 1 | 1 |
| 9 | | | | | | | | 6 | 5 |

| Terminal | First occupied column in Parquet[ ] |
|---|---|
| 1 | 5 |
| 2 | 8 |
| 3 | 7 |
| 4 | 9 |
| 5 | 6 |
| 6 | 7 |
| 7 | 8 |
| 8 | 9 |
| 9 | 0 |

Update:

Update $u_{i,k} = u_{i,k} \pm K$
$u_{i,k} = K$
$u_{i,k} = 0$

A $u_{z,k} = u_{z,k} + \delta(u_{z,i})$    $u_{z,i} \neq 0$
$\delta = \pm 1$
$\delta = 0$
$z = i+1,(1),k$
$u_{k,s} = u_{k,s} + \delta(u_{i,s})$    $u_{i,s} \neq 0 \vee s = k$
$\delta = \pm 1$
$\delta = 0$
$s = k,(1),n$
$n$ = NUMBER OF TERMINALS

$u_{ik}^j = u_{ik}^{j-1} + \delta(u_{j-1,k}^{j-1}, u_{i,j-1}^{j-1})$
$\delta = 1$    $u_{jk}^{j-1} \wedge u_{ij}^{j-1} \neq 0$
$\delta = 0$
$j = 2(1)n-1, i = j+1(1)n, k = j(1)n$
$n$ = NUMBER OF TERMINALS

METHOD OF INITIALIZING AND UPDATING A NETWORK MODEL

BACKGROUND OF THE INVENTION

FIELD OF THE INVENTION

The invention relates to a method of initializing and updating a network model, wherein a network topology is formed in the form of a network graph.

The network model may relate to networks of a wide variety of types, for example to electrical networks, gas networks or communication networks. However, to simplify matters, an electrical power supply network is always referred to below.

In order to monitor and manage electrical networks, awareness and representation of the topological network state and tracing of the network voltage are of fundamental significance. Therefore, in the master computers of network management systems, topological network models are initialized and kept on the basis of static information, the topological data of the network, and continually updated on the basis of telecommunicated switch messages and measured values (dynamic information) as process images of the transmission or distribution network to be managed.

The topological network models are used for different purposes, for example for a graphic representation of a current network state, preferably by coloring parts of the network being represented, as is described, for example, by W. Grein et al. in "Dynamic Network Colouring", Proceedings of the Eighth Power Systems Computation Conference (PSCC), Helsinki, Aug. 19–24, 1984, pages 489 to 496. They are also used as an information function for global interlocks, for example switching to earth or ground, or as a basis for calculations. Such typical calculations may relate to a consistent network state (state estimation) or a simulated network state (load-flow calculation). Furthermore, there are separate calculation functions for the determination of local bay topologies.

Known methods of initializing and updating are based on algorithms for graphs or sparse adjacence matrices. Those methods make it necessary, for establishing the network interrelationship (initialization), to search the graph of the network and to determine a spanning tree for each component. In the case of large networks, that entails considerable effort. Therefore, in the event of a switch change it is attempted to carry out only the really necessary changes (update) to the data structures which describe the network graph or the sparse adjacence matrix. The determination of those necessary changes may be very involved, depending on the network change. Therefore, for marked changes, the ratio of update to initialization is on the order of magnitude of 1:10. In the event of a fault, a large number of switch messages which enter into the supervisory control system have to be processed sequentially by the topology function. In order not to overload the master computer with a continuous sequential processing of topological updates in a critical situation, use is made of overload methods which instigate a topology update or topology initialization, depending on the situation. All of the previously known update methods are involved, complex and not complete in a mathematical sense, and therefore susceptible to errors. Due to the complexity, the program packages being developed are very extensive and the associated program maintenance and the familiarization of new employees with the application of those programs is very involved.

In the area of sparse vector methods and sparse matrix methods algorithms have been developed which can also be used for large electrical networks when performing network calculations. Such methods are described, for example, by V. Brandwajn et al. in "Sparse Vector Methods" IEEE Transactions on Power Apparatus and Systems, Vol. PAS-104, No. 4, February 1985, pages 295 to 301. In that publication, terms are also explained which are used in this description, such as network graph or path table. The calculation methods described by Brandwajn et al. presuppose that a network topology already exists. An investigation of application possibilities of such methods for topology determination is not known.

SUMMARY OF THE INVENTION

It is accordingly an object of the invention to provide a method of initializing and updating a network model, which overcomes the hereinafore-mentioned disadvantages of the heretofore-known methods of this general type and which determines a network topology that permits a comparatively not very involved and quickly performable initialization and updating of a network model.

With the foregoing and other objects in view there is provided, in accordance with the invention, a method for initializing and updating a network model, with a networked topology being formed in the form of a network graph by applying and extending sparse vector methods and sparse matrix methods, which comprises:

a) preparing captured network topology data in the form of a terminal adjacence matrix;

b) transforming the terminal adjacence matrix into an upper triangular matrix, with additional fictitious connecting branches possibly being produced;

c) initializing the upper triangular matrix, with each element of the upper triangular matrix being initialized on a basis of an associated branch status; and c1) initializing each element belonging to a switched-on branch, with a small negative integer constant K not being able to become greater than zero through further processing steps; and c2) initializing each element belonging to a switched-off or fictitious branch, with zero;

d) forming matrix products for all rows i (i=1 up to a maximum number of rows) of the upper triangular matrix from and excluding a diagonal according to the following rule: if elements i, j and i, k are not equal to zero, incrementing elements of points of intersection of a row and column fraction of the upper triangular matrix by 1, with the elements j and k being loop indices for all of the elements of the row concerned;

e) forming a path table from the upper triangular matrix, with the path table indicating an incident terminal index of a first element of a row differing from zero, for each row or each terminal of the upper triangular matrix;

f) updating the upper triangular matrix in the case of a change of the captured network topology data, being a change in status of a network branch, by the following measures:

f1) in the case of switching off a network branch: subtracting the constant K from the corresponding current (=previous) value of the matrix element;

f1.1) if this element becomes zero as a result, decrementing by 1 the elements of all of the points of intersection of the upper triangular matrix of this row and column element with all of the other elements not equal to zero of the associated row or column, to the right of or beneath the diagonal; repeating the step f1.1) for further elements if they become zero as a result;

f2) in the case of switching on a network branch: adding the constant K to the current value of the matrix element;

f2.1) if this element becomes K or, for further repetitions, becomes 1 as a result, incrementing by 1 the elements of all of the points of intersection of the upper triangular matrix of this row and column element with all of the other elements not equal to zero of the associated row or column, to the right of or beneath the diagonal; repeating the step f2.1) for elements if they become 1 as a result;

g) updating the path table in accordance with step e);

h) identifying components of the network graph using the path table, with the first terminal index of the table being taken as a basis for assigning the same component identification to all of the terminals of an associated subpath; if an already allocated identification occurs when running through further subpaths (due to encountering a component which has already been assigned an identification), assigning the identification to the subpath being run through at that time; and breaking down the network graph into subgraphs in a manner corresponding to the number of the identifications allocated.

In accordance with another mode of the invention, there is provided a method which comprises setting the constant K as an adequately large positive number, and executing incrementing operations instead of decrementing operations and vice versa, on the matrix elements.

In accordance with a further mode of the invention, there is provided a method which comprises using internal and external topological addresses for preparing the network topology data in an expedient data structure, with a defined topological hierarchy being taken as a basis for designating each hierarchical stage with an identifier, placing the association with certain components of the higher hierarchical stages in an external topological address of a terminal (lowest hierarchical stage), and deriving abstract end points of the network graph from that association as internal topological addresses.

In accordance with a concomitant mode of the invention, there is provided a method which comprises topologically assigning measured values and protection signals, and in the case of a model of an electrical network, modelling measured performance values as directed impedanceless branches and modelling measured voltage values as objects with an external topological address.

The method according to the invention permits an initialization or updating of a topology model which is faster by orders of magnitude than known methods. In addition, the updating (update) time is largely independent of the size of the network.

According to an advantageous refinement, use is made of a topological address, which simplifies data input and makes it possible to integrate topological functions, for example bay topologies, into the network topology calculation. In this case measured values are also modelled as topological objects, whereby data input is simplified and an exact description is possible even of those network configurations in which until now additional pseudo network elements have had to be provided.

Network calculations which can be based on the modelled network topology are significantly speeded up by application of the method according to the invention, because necessary data structures and processing steps are already included in the proposed method. There also emerge new ideas and aspects for programs such as (n-1) failure calculation and topological observability analysis. All of those programs have in common the evaluation of topology variants of the network. They profit from the fast update method. Therefore, significant improvements are expected for all tasks in which effects of network changes have to be established very quickly. These may be, for example, topology methods for communication networks or else optimization methods with the aid of network flow algorithms.

Other features which are considered as characteristic for the invention are set forth in the appended claims.

Although the invention is illustrated and described herein as embodied in a method of initializing and updating a network model, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a table showing a terminal adjacence matrix and its LDU factorization;

FIG. 7 is a table showing an initialization of an upper triangular matrix;

FIG. 8 is a table showing an upper triangular matrix initialized with integers;

FIG. 10 is a table showing a mathematical formulation of initialization and update;

FIG. 11 is a table showing an upper triangular matrix updated with integers;

FIG. 14 is a table showing a derivation of a node-admittance matrix;

DESCRIPTION OF THE PREFERRED EMBODIMENTS

Figure 1:
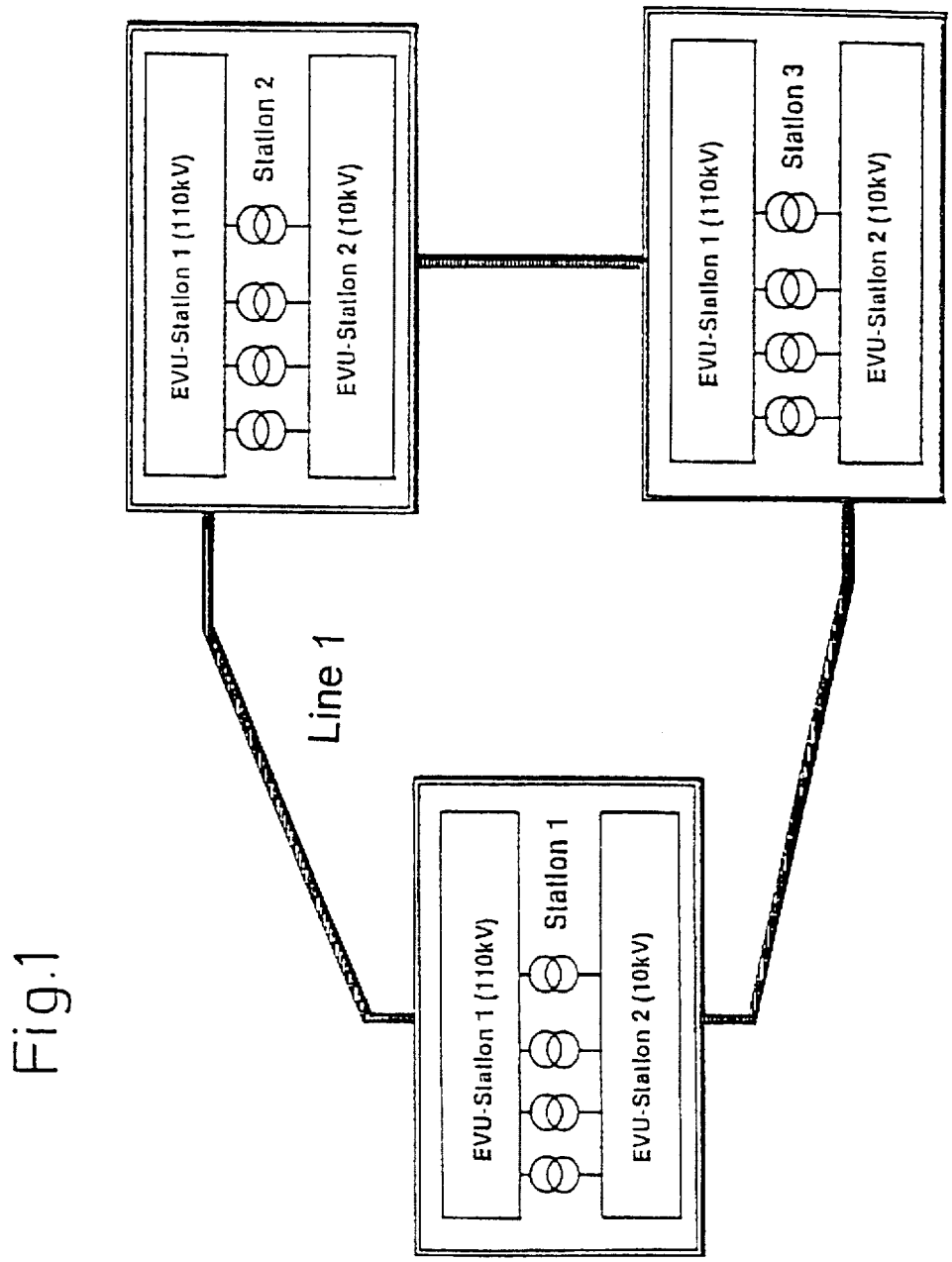
FIG. 1 is a block diagram showing stations and power supply company (EVU) stations.

Referring to the figures of the drawing as a whole, it is seen that examples given below for explaining the method are based on the following advantageous definition of an external and internal topological address for electrical transmission and distribution networks. This definition simplifies the data input and makes it possible to integrate local topological functions (bay topology calculation) into the network topology calculation.

Electrical networks, irrespective of the voltage level, can be described by end points (terminals) and their connections (branches). Connections in this case are impedance-affected network elements such as a line, transformer or longitudinal reactive power element etc., or impedanceless network elements such as a power circuit-breaker, disconnector or measured value object. End points are external topological addresses in the network and can be assigned to network elements such as busbar sections or parts of network elements, for example the two ends (terminals) of a line. In the case of electrical transmission and distribution networks, the following topological hierarchy is thus defined:

| 1 | Station (or geographical station) |
| 2 | Power supply company station (or voltage level) |
| 3 | Bay |
| 4 | Terminal |

Figure 2:
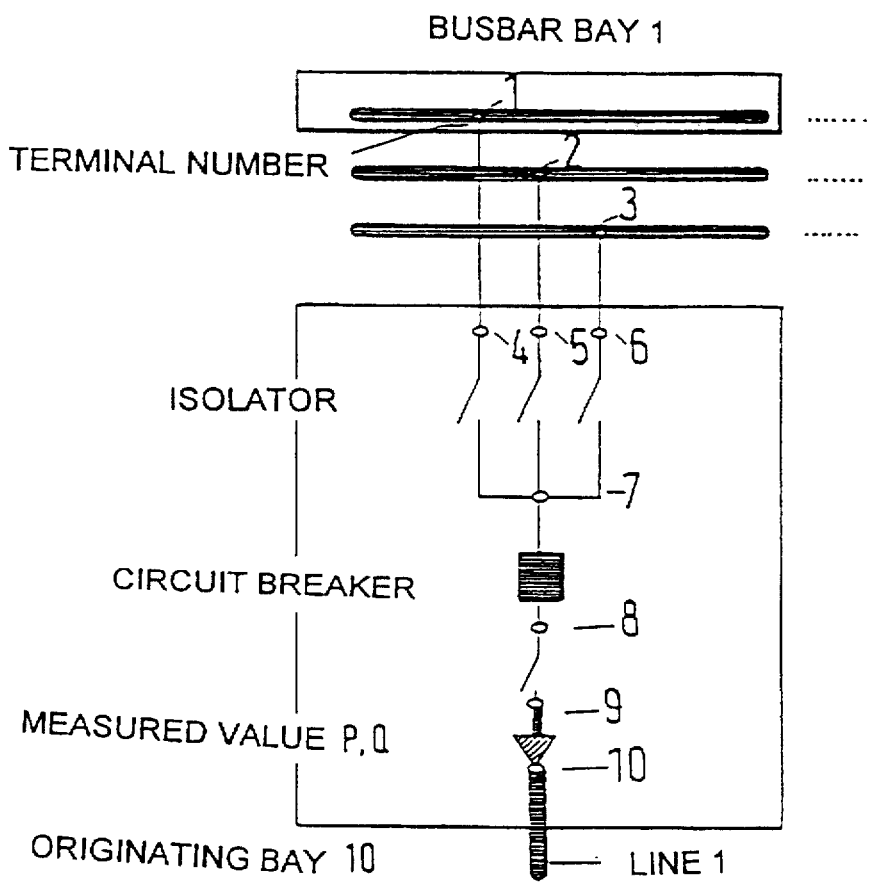
FIG. 2 is a schematic circuit diagram showing a structure of a field in a power supply company station.

By way of example, FIG. 1 shows a network including three stations with two power supply company stations in each case. FIG. 2 shows the structure of a bay in a power supply company station, which is self-explanatory from the symbols and labelling that are used.

The external topological address then becomes the data structure, containing an identifier for each of these hierarchal stages. For example, the topological address of one end of a line 1 in a station 1 (see FIGS. 1 and 2) may be specified as follows:

| 1 | Station: | 1 |
| 2 | Power supply company station: | 1 |
| 3 | Bay: | 10 |
| 4 | Terminal: | 10 | and may be read as follows: the topological address described is located in station 1; within station 1 it is in power supply company station 1; within the power supply company station it is in bay 10; and within bay 10 it is at terminal 10. FIG. 1 and FIG. 2 illustrate the procedure clearly.

As far as the limit of each hierarchical stage is concerned, a rule which applies is that they must not overlap. That is to say, each terminal may belong only to one bay, each bay may belong only to one power supply company station and each power supply company station may belong only to one station.

Thus, it is possible to establish the abstract end points, i.e. the internal topological addresses, of the network graph, from the technological description of the network topology in a very simple and quick way, through the data structure described below, which is provided by the data preparation.

Figure 3:
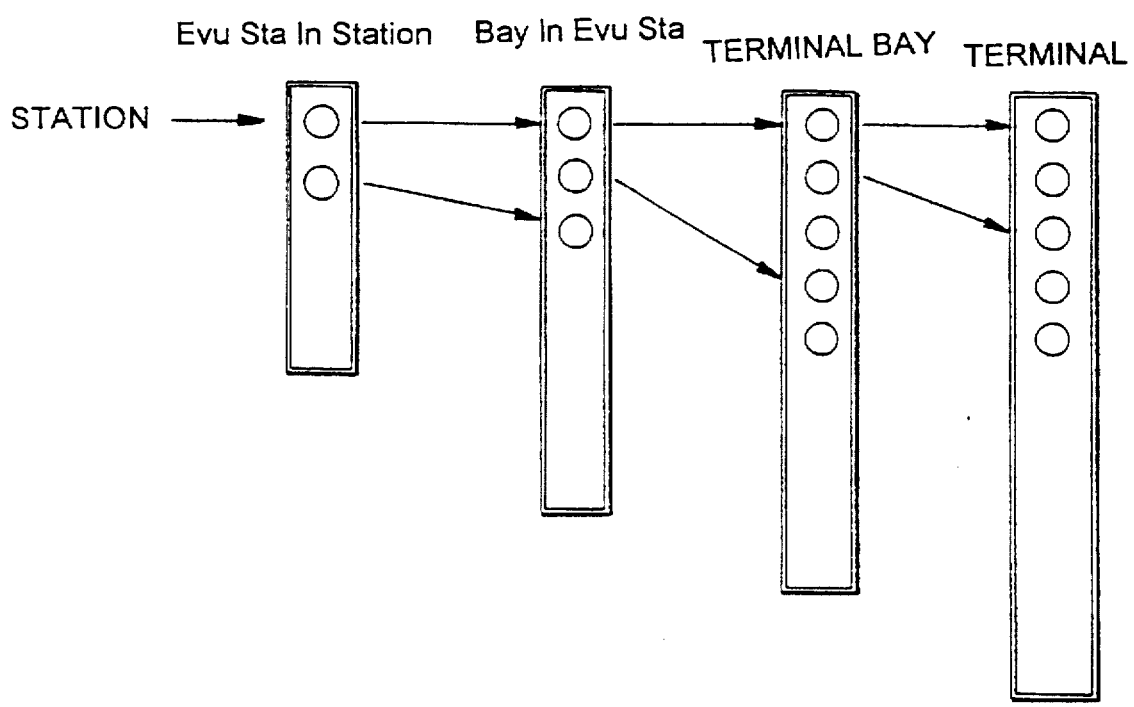
FIG. 3 is a block diagram showing an address transformation.

The transformation of the external topological address into the internal topological address is represented in FIG. 3 and is described by way of example below:

All of the power supply company stations of a station i lie between data structures EvuStaInStation[i] and EvuStaInStation[i+1], where reference symbol Evu stands for power supply company. Identifiers are contained in the data structure EvuStaInStation[], so that their respective subaddresses do not have to lie close together but can be established by direct comparison. An exception is the station identifier, which serves as an index for the data structure EvuStaInStation[]. The other hierarchical stages are run through correspondingly. The finally established index of the data structure Terminal[] is the internal topological address of the terminal point specified by the external topological address. The internal topological address is used as an index for the end points (internal terminal index) of the network graph.

An establishment of the bay topology as an implicit part of the network topology is possible by taking the bays as a subaddress into consideration. This makes it possible to dispense with the calculation functions for establishing the local bay topologies.

Measured values and protection signals can also be modelled as topological objects. This simplifies data input and permits the exact description of all network configurations in which pseudo network elements had to be additionally provided until now.

Measured values are telecommunicated analog values of relevant process variables such as voltage, current and performance, etc., which are displayed in the master computer and are monitored for limit value violation. In the case of supervisory control systems, which likewise keep a topological model in the master computer, the measured values are used in conjunction with the network topology and the electrical parameters of the network elements for the calculation of a consistent and complete network state (state estimation). For this purpose, measured performance values must be assigned in each case to the adjacent impedance-affected network elements and voltage measured values must be assigned to the nodes of the network model. All of the network elements which are interconnected without impedance are referred to as nodes in this case. Nodes are connected by impedance-affected branches such as lines and transformers. Until now, measured values and network elements have been statically combined in data input. That has a disadvantage which is that for certain network configurations the measured values have to be placed differently than corresponds to their network configuration. That serious disadvantage is avoided if measured performance values are modelled as directed impedanceless branches and voltage measured values are modelled as objects with an external topological address. The circuit-dependent assignment of measured value and network element is then performed by the network topology. Furthermore, the direction of the reference arrow of the measured values is fixed directly by the orientation of the measured value branch.

Figure 4:
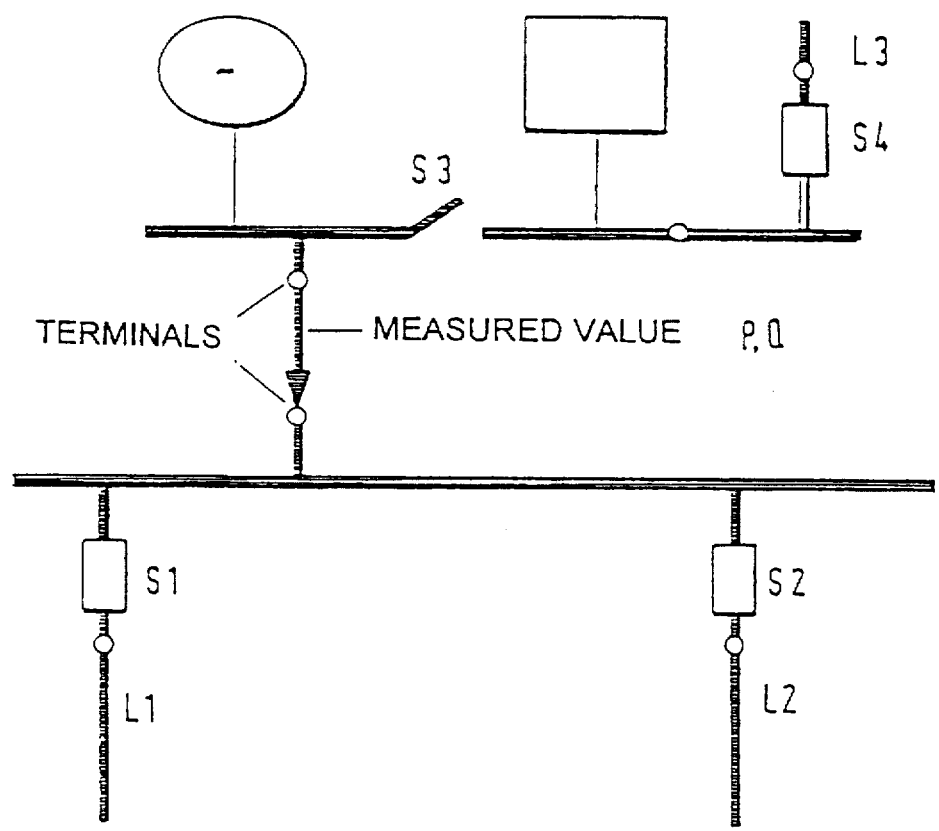
FIG. 4 is a circuit diagram showing a measured value assignment.

The topological assignment described is represented in FIG. 4. Reference symbol P designates active power values and reference symbol Q designates reactive power values. Depending on the switching state of switches S1 to S4, the measured value assignments listed in the following table and their characteristics result, where L1 and L2 are lines.

TABLE 1

Topological measured value assignment

| S1 | S2 | S3 | S4 | Measured value characteristic | Assignment |
|----|----|----|----|------------------------------|-----------|
| ON | ON | ON | ON | Total flow | L1, L2 |
| ON | ON | ON | OFF | Feeding | Generator load |
| ON | ON | OFF | ON | Feeding | Generator |
| ON | ON | OFF | OFF | Feeding | Generator |
| ON | OFF | ON | ON | Flow | L1 |

TABLE 1-continued

Topological measured value assignment

| S1 | S2 | S3 | S4 | Measured value characteristic | Assignment |
|---|---|---|---|---|---|
| ON | OFF | ON | OFF | Flow | L1 |
| ON | OFF | OFF | ON | Flow | L1 |
| ON | OFF | OFF | OFF | Flow | L1 |
| OFF | ON | ON | ON | Flow | L2 |
| OFF | ON | ON | OFF | Flow | L2 |
| OFF | ON | OFF | ON | Flow | L2 |
| OFF | ON | OFF | OFF | Flow | L2 |
| OFF | OFF | ON | ON | — | — |
| OFF | OFF | ON | OFF | — | — |
| OFF | OFF | OFF | ON | — | — |
| OFF | OFF | OFF | OFF | — | — |

Whereas the measured value can be assigned only to one network element in the static assignment, the topological assignment makes a correct assignment possible in all cases with simplified data input at the same time. The same procedure applies analogously for directed protection signals such as transient earth or ground fault signals and short-circuit indicators, which are evaluated by the topology function for the locating of earth faults or short circuits.

A detailed exemplary description of the method according to the invention is given below by applying the above address definition. All of the method steps can be realized as a computer program and can be performed in an automated manner with the aid of a data processing system.

1. Structure of the Static Topology

The graph of the network being considered includes end points, so-called terminals, as well as impedanceless and impedance-affected branch (two-port) networks such as switches, measured values, connectors and lines, transformers and longitudinal reactive power elements. Furthermore, there are additional one-port networks such as generators and loads, measured voltage values and earthing or grounding switches, etc., which have only one topological address and various attributes and characteristics that they transfer to the associated subgraph, such as earthed, voltageless or under voltage, for example.

The data structure of the method is based on a terminal adjacence matrix which is stored as a forward-chained list and in which the adjacent branches are assigned (referred to below as Cst[]) for each terminal. In the case of this symmetrical matrix, which contains pure structural information, an optimum elimination sequence is determined and Cst[] is supplemented by the Fill In (fictitious connecting branches) additionally occurring in this case. Due to the similarity with the numerical LDU factorization of a matrix, this step is referred to below as structural triangular or LDU factorization. LDU factorization is understood as the factorization of a matrix into the product of a lower matrix, diagonal matrix and upper matrix, with the lower matrix and upper matrix being triangular matrices in each case. In order to illustrate clearly the topological characteristic of the Fill In, these are referred to below as fictitious branches. As is shown below, the structural upper matrix (referred to below as Parquet[]) contains information on the connectivity of the graph, which can be updated very simply and quickly in Parquet[] in cases of network changes.

Figure 5:
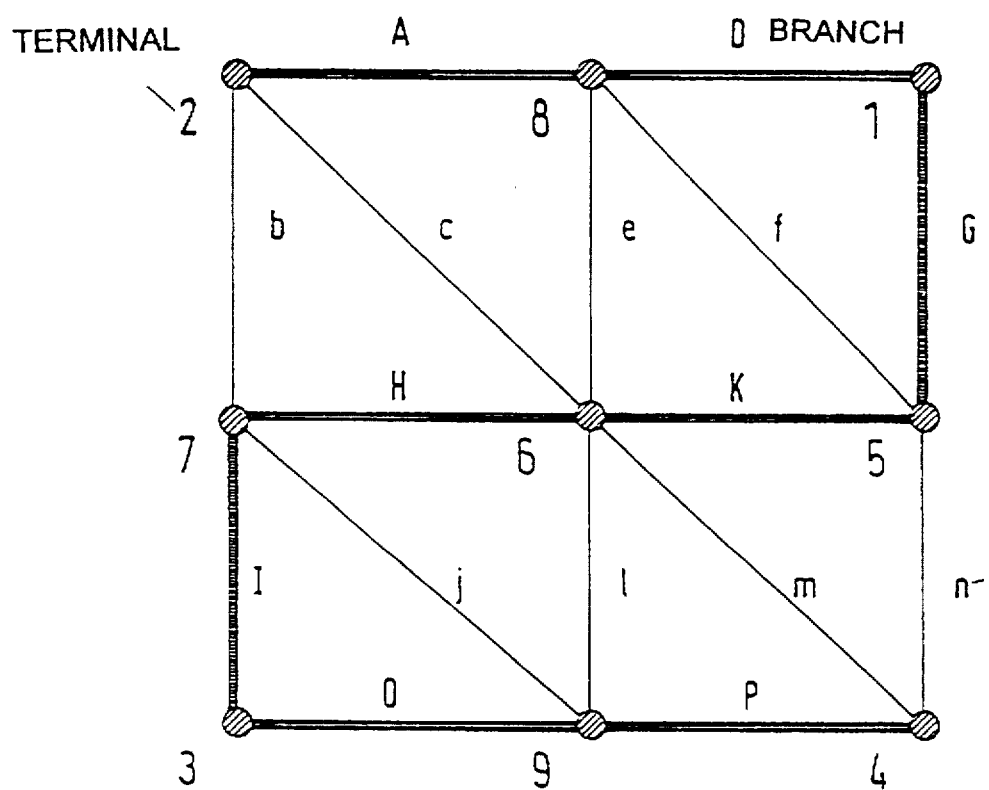
FIG. 5 is a sample graph.

The sketched data structures are illustrated clearly by a small sample graph shown in FIG. 5. All of the branches depicted in the graph are a component part of the static topology. The branches identified by upper-case letters have the status ON and those identified by lower-case letters have the status OFF. In this example, only the internal terminal indices and branch designators are given. The mapping of an external topology address onto an internal topology address takes place with the aid of the explained address hierarchy and can be simply omitted in this case for reasons of overall clarity. Likewise, the branch type is of secondary importance in this example. Therefore, a detailed description is not given, without restricting the generality of the example. In the following stages, the sample network with 9 internal topological addresses and 16 two-port networks or branches is mapped onto the data structures sketched above.

Figure 6:
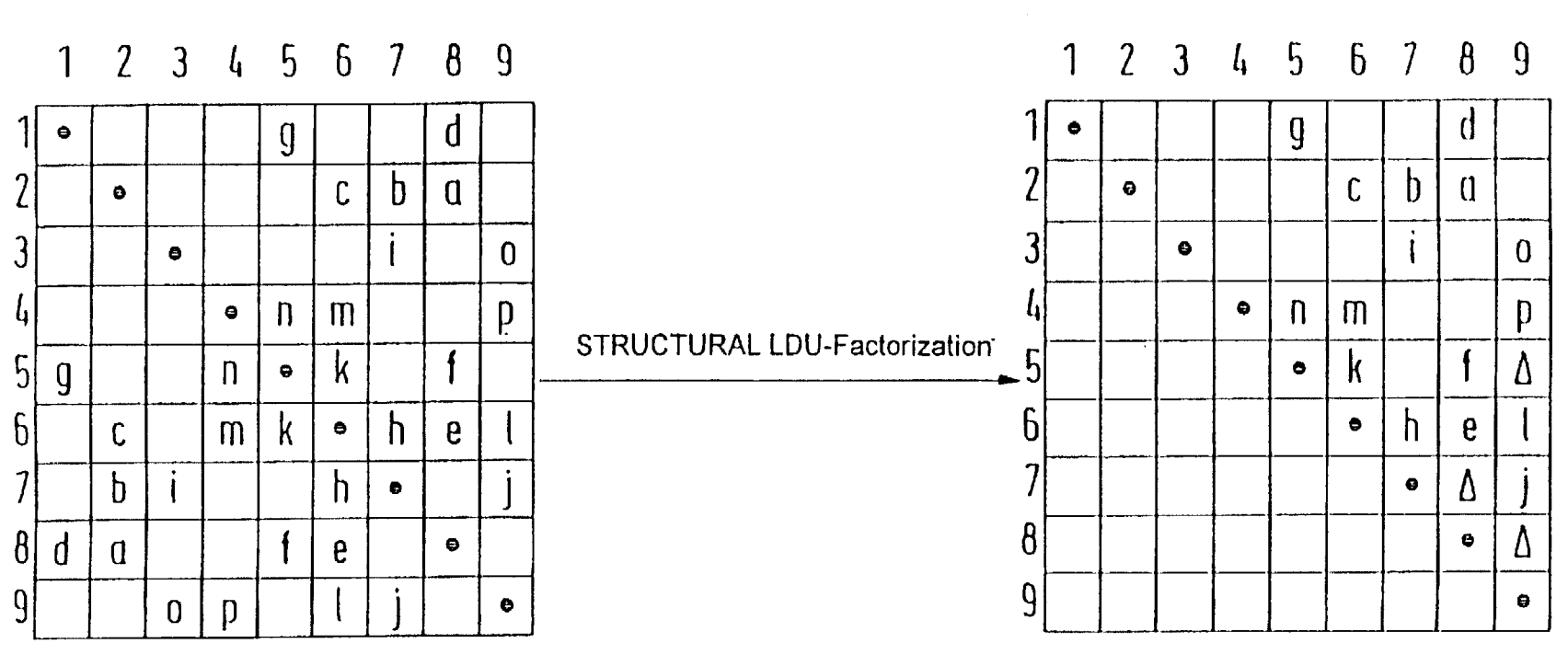

The terminal adjacence matrix for this graph and its LDU factorization can thus be noted as in FIG. 6. In order to provide a more specific explanation of the algorithm, the matrix elements contain the designators of the associated branches. The elements of the matrix identified by reference symbol Δ correspond to the Fill in, i.e. the fictitious branches in the network. In order to simplify matters, in the case of this example, the sequence of the symbols is chosen to be already at an optimum. The internal program storing of the terminal adjacence matrix takes place as a compressed-stored, forward-chained list (Cst[]), which of the LDU matrix takes place as a one-dimensional array (Parquet[]) of C structures. Due to the structure symmetry, only the upper matrix is stored. It is assumed below that all of the rows of the upper matrix and all of the elements of these rows are sorted in an optimum sequence. For each non-diagonal element, each object of the chained list or of the array contains the terminal index of the opposite terminal, the index in the branch list, the status of the branch and the branch type.

2. Initialization of the Upper Matrix (see FIGS. 7, 8 and 9)

Each element of the upper matrix is initialized on the basis of the associated branch status:

Status ON=>K=SCHAR_MIN (−128, minimum value of a byte with operational sign); status OFF: =>0. The fictitious branches receive the status OFF (0). In the case of the matrix which is thus initialized, the following procedure is performed and, alluding to the purely integer-based operations, it is referred to as integer initialization. This takes place analogously to the matrix product of all of the rows as from the first non-diagonal element to the right of the diagonal with themselves:

---

For all rows i
    For all row elements j, k of row i to the right of the
    diagonal, where i=1 .. n, j=i+1 .. n, k=j .. n and n=number
    of terminals:
        If the associated matrix elements (i, j) and (k,
        i) are not equal to 0:
            increment the elements of all of the associated points of intersection of the row and column fraction to the right or beneath the diagonal in the upper matrix by 1. Due to the structure symmetry, the row and column fraction is identical
In the case of the first row in FIG. 7, the first non-diagonal point of intersection is the matrix element (5, 8) and this element is assigned the branch f. This element is initialized with 0 and receives the current value of 1.

---

Figure 7:
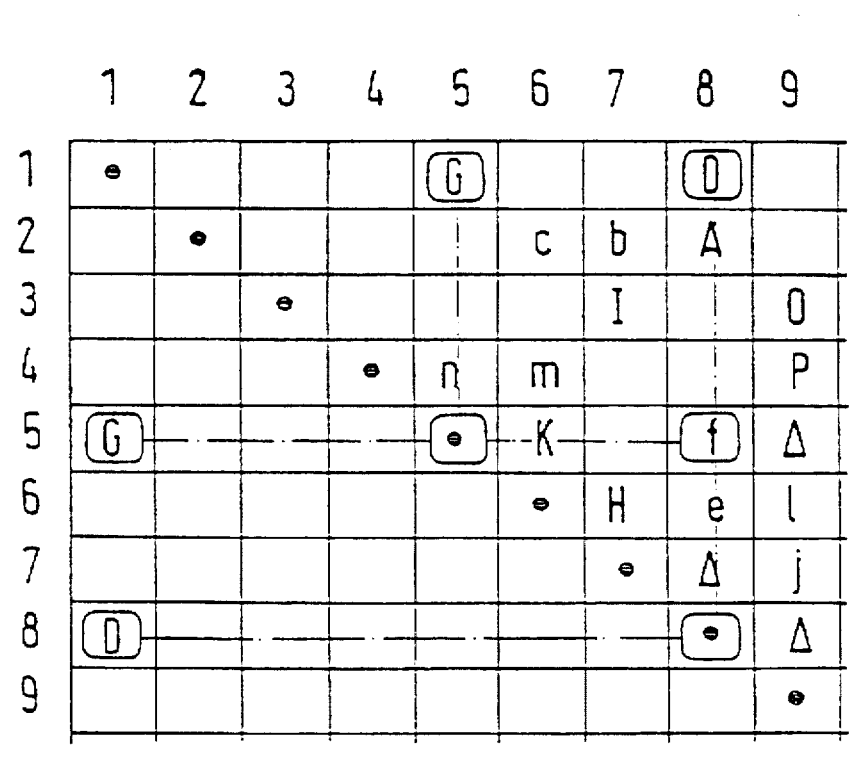

In FIG. 7, this is illustrated clearly for the first row. After this integer initialization, the upper matrix represented in FIG. 8 is obtained. Normally printed lower-case letters correspond to switched-off branches and have the status counter 0, and normally printed upper-case letters correspond to switched-on branches and have the status counter SCHAR_MIN+i, wherein i is determined by the number of incrementing operations executed on this element. The elements of the matrix identified by Δ correspond to the Fill In, i.e. the fictitious branches in the network, which receive the status ON or OFF in accordance with the current topology on the basis of the integer-based operations. This corresponds to a status counter 0 or i, wherein i is determined by the number of incrementing operations executed on this element. Although the branches designated by bold-printed lower-case letters have the current status OFF, because of the integer-based operations they receive the status of a connecting branch and likewise have a status counter of i, where i=the number of incrementing operations. Furthermore, the status of the branch may also depend on its type, for example in order to establish specific topologies, such as a network district topology, for example. In order to establish the network district topology, all of the transformers have to be specified as separating branches.

Figure 9:
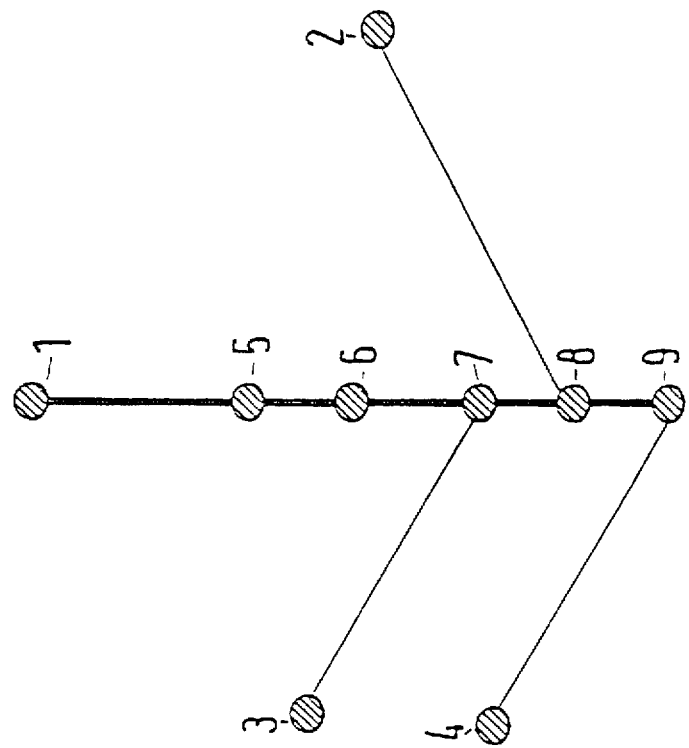
FIG. 9 is a path table and a path graph (example)

The connectivity of the graph can then be derived very simply from a PathTable [] of an upper-matrix Parquet [] (see FIG. 9).

This path table contains the opposite terminal index of the first adjacent branch for each terminal index in Parquet []. Along with the upper matrix, this table is the second essential data structure of this topology method, and the connectivity of the network graph can be easily established therefrom. This table contains as many entries with the value 0 as the network graph breaks down into subgraphs. The path table represented in FIG. 9 can be derived from the above Parquet [] structure. This path table contains only one 0 and the network graph is therefore connected, as can be easily seen from the path graph in FIG. 9.

For example, by assignment of a color reference point for the coloring of the network graph or of an attribute for identifying certain states with respect to an entry of this path table (i.e. internal topological address or terminal index), the corresponding subgraph can then be assigned the associated color or characteristic in which the path graph is run through.

Figure 12:
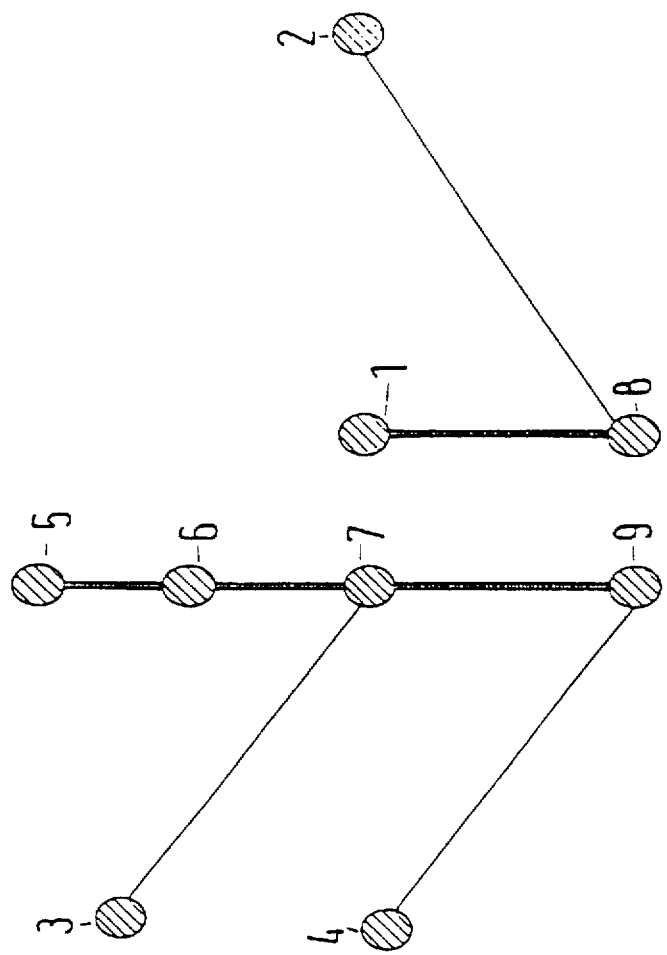
FIG. 12 is a path table and a path graph for modified sample graphs.

3. Update of the Network Topology (see FIGS. 10, 11 and 12)

Figure 11:
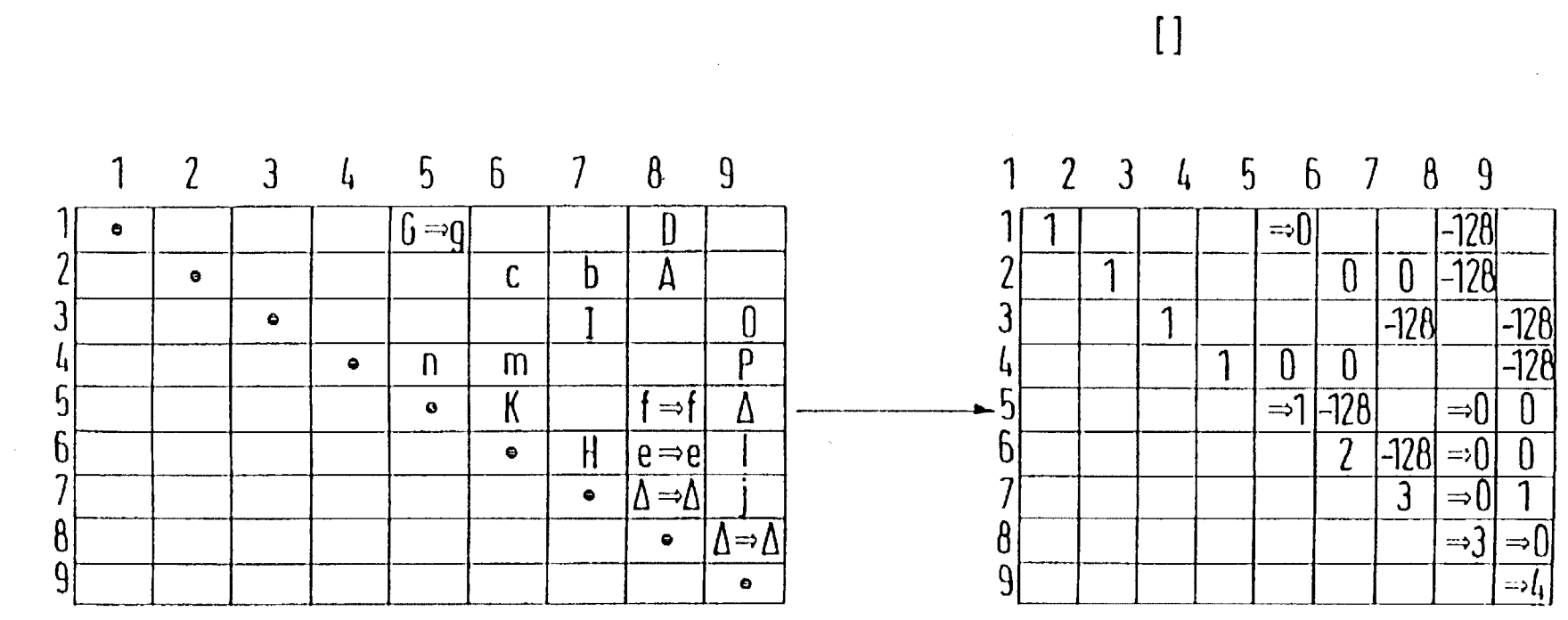

Assuming that the status of the branch G in the sample graph changes from ON to OFF. The integer update algorithm then establishes changes for matrix elements identified by =>, as FIG. 11 shows.

The algorithm can be formulated as follows for a switching off or switching on of a branch:

---

Switching off of a branch:
Subtract the constant K from the corresponding element
of the upper matrix. If, as a result, this element
becomes 0[1]:
Update OFF:
  For this element:
    decrement the corresponding elements in the upper
    matrix by 1 for all points of intersection of this
    element with all other elements not equal to 0 of the
    associated row or column to the right of or beneath
    the diagonal. For each element which becomes 0 as a
    result, repeat Update OFF
Switching on of a branch
Add the constant K to the corresponding element of the
upper matrix. If, as a result, this element becomes K[1]:
Update ON:
  For this element:
    decrement the corresponding elements in the upper
    matrix by 1 for all points of intersection of this
    element with all other elements not equal to 0 of the
    associated row or column to the right of or beneath
    the diagonal. For each element which becomes 1 as a
    result, repeat Update ON.

---

[1]Only then does the change in state have a topological influence and the updating of the upper matrix may take place.

For this example, the decrementing of the matrix element (8, 9) leads to this element receiving the value 0. It follows therefrom that the updated path table receives a further zero entry, i.e. the network graph is broken down into two subgraphs. The path table represented in FIG. 12 can be established from the updated Parquet [] structure. It is obvious from the path table and from the path graph that the graph is broken down into subgraphs. A coloring or passing on of an attribute is then made possible very simply and very quickly by the processing of the path table.

4. Load-flow Interface

Figure 13:
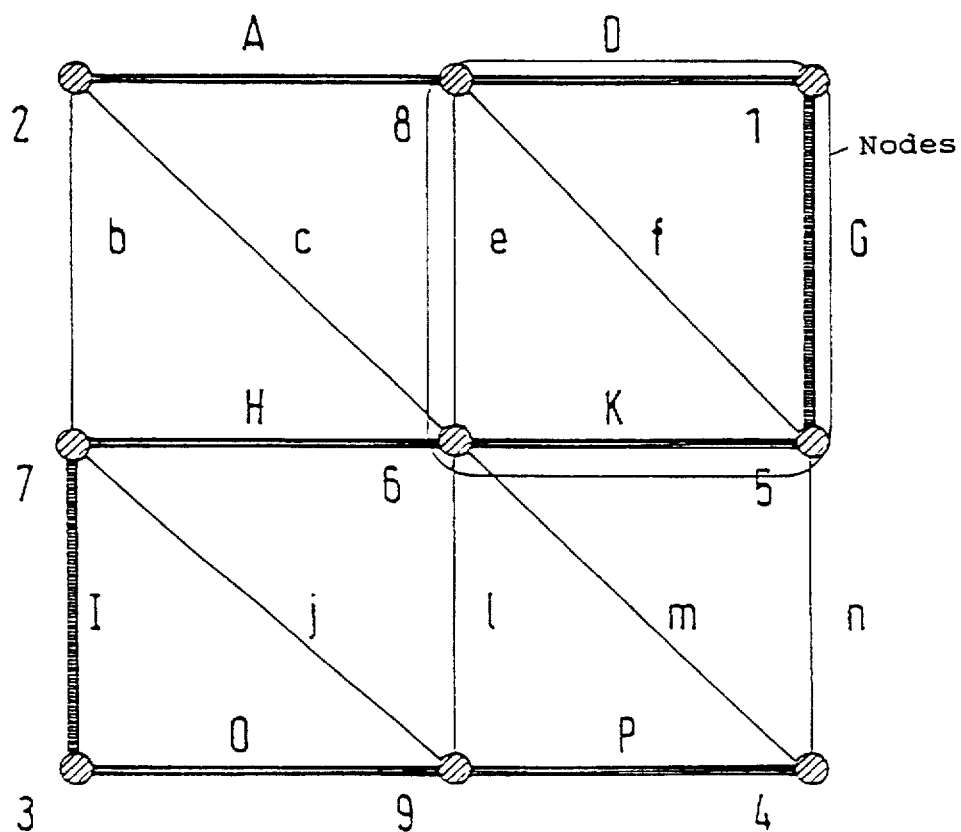
FIG. 13 is a node-branch network.

The structure of the LDU matrix for load-flow or short-circuit calculations is obtained in two stages. In a first stage, all of the impedanceless branches, apart from the measured values, are combined to form nodes. Subsequently, the measured values are assigned to the impedance-affected network elements and, in a second stage, the measured values are likewise fused with the nodes. FIG. 13 shows a node-branch network. If it is assumed that the branches D, e, f, G, K are impedanceless, the (LD)U form of the node-admittance matrix can be extracted directly from Parquet []. In this example, we have dispensed with a measured value assignment.

Figure 14:
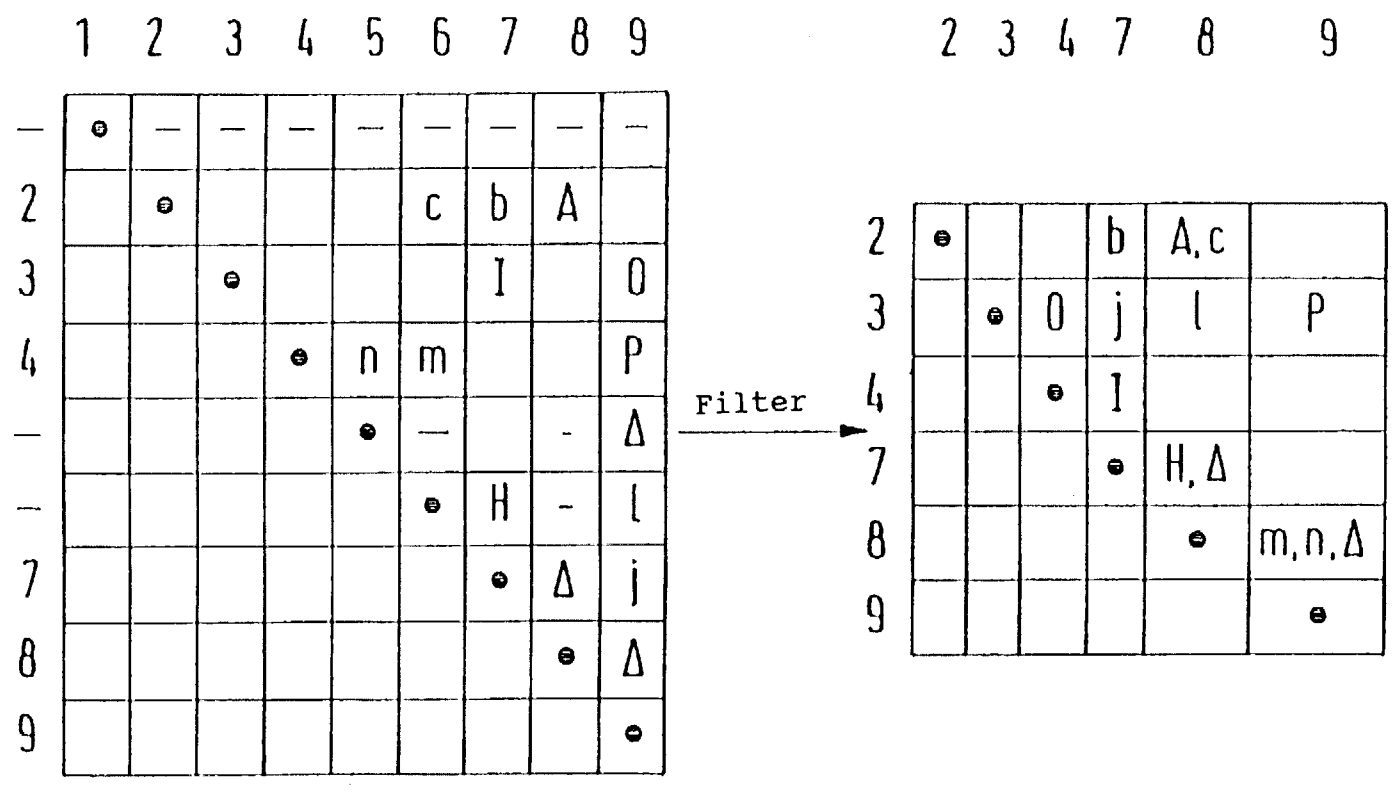

Terminals 1, 5, 6, 8 fuse into the node 8, while all of the other terminals are connected by impedance-affected branches and therefore remain in existence. Thus, an upper form of a structural JACOBI or node-admittance matrix represented in FIG. 14 is obtained.

The filter function eliminates all of the impedanceless branches and transfers the branch ends (terminals) concerned from impedance-affected branches to the terminals having a higher index, such as in this case, for example, 1, 5, 6→8. This is consequently already the structure of the JACOBI matrix (load flow) or of the node-admittance matrix (short-circuit). The further steps of a load-flow calculation are then simple to perform. Since the LDU factorization is already performed at the basic topology level (switch terminal), it is possible to do without many program steps. This simplification of the programs to a considerable extent improves the computing time and the error susceptibility of the calculation programs such as state estimation, load-flow and short-circuit.

5. Test Networks

Figure 15:
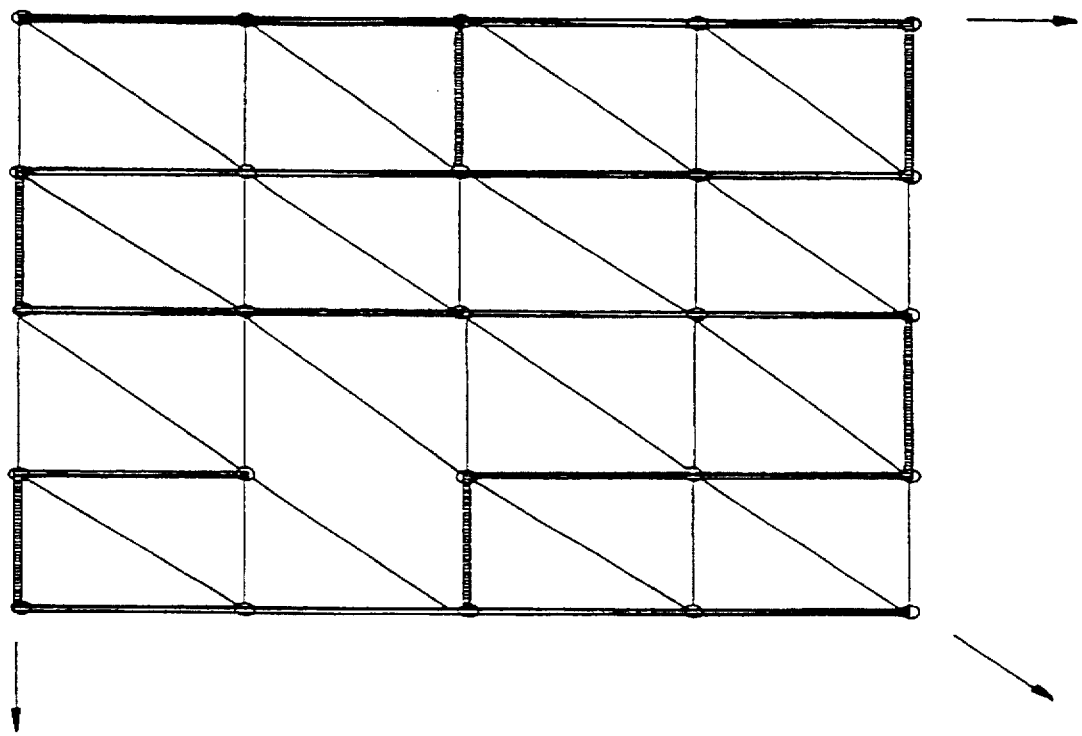
FIG. 15 includes test graphs for performance measurement.

FIG. 15 shows the form of a generable network with which performance tests were performed for the algorithm. By parameter default, a degree of intermeshing VG of the network can be preselected between 0 and 3 and a size of the network can be preselected as desired. The degree of intermeshing results from formula (1):

$$VG = \frac{\text{Number of branches}}{\text{Number of terminals} - 1} \quad (1)$$

In electrical transmission networks and distribution networks, the degree of intermeshing varies between 1 and 1.5. In the case of a large real distribution network, for example, the associated degree of intermeshing VG, including feeding-in 110 kV stations and transformers, works out as follows:

| | |
|---|---|
| Number of switches (without earthing switches): | 9683 |
| Number of lines: | 2100 |
| Number of 110/10 kV transformers: | 22 |
| Number of 10/0.4 kV mains transformers: | 1200 |
| Number of branches: | 13005 |

With the number of terminals at 11,623, a degree of intermeshing of VG=1.119 is obtained. This means that the performance figures presented below for VG=1.2 in cases of large distribution networks are to be regarded as the upper limit.

6. Performance

Figure 16:
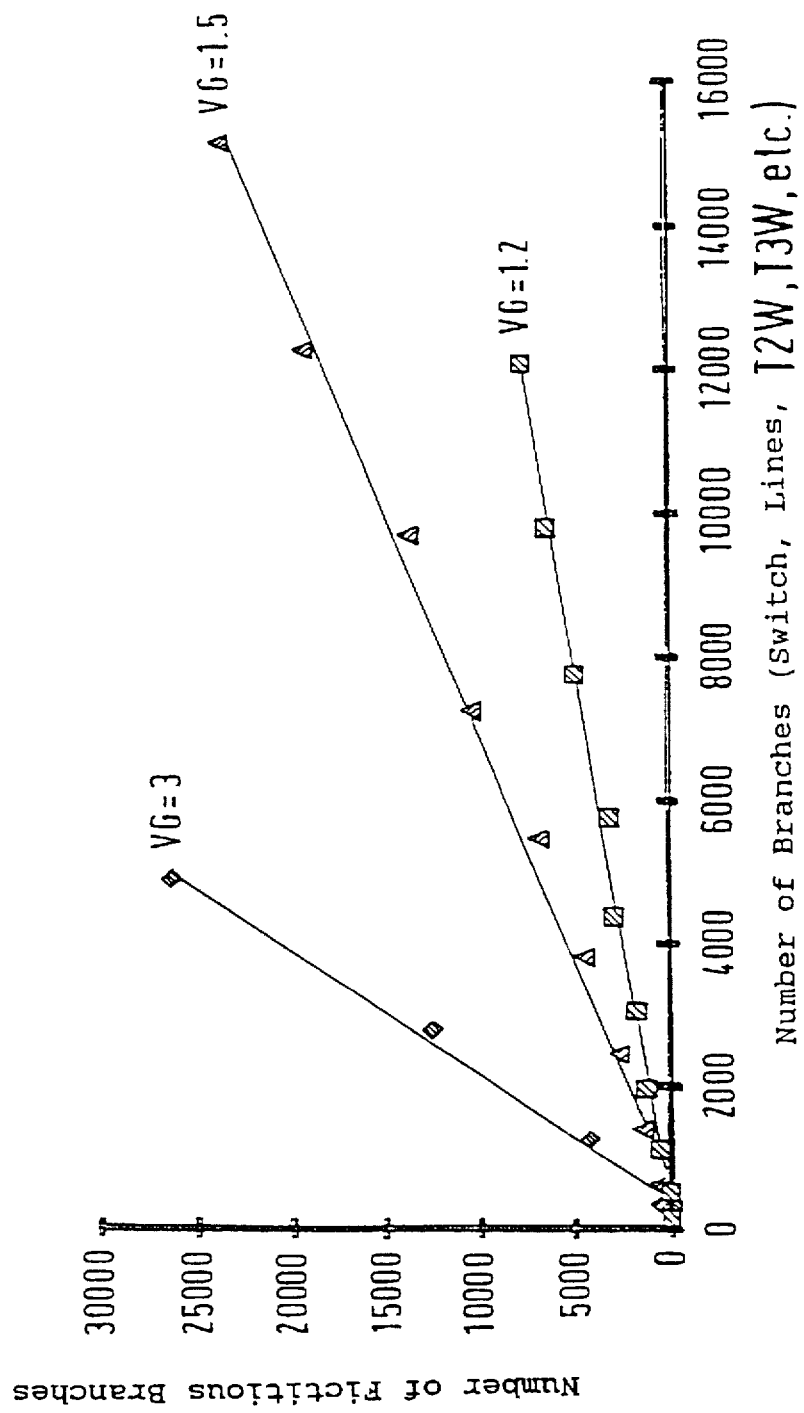
FIG. 16 is a diagram showing fictitious branches in dependence on a size of network and a degree of intermeshing.

6.1 Number of fictitious branches over the size of the network in dependence on the degree of intermeshing As described above, the terminal adjacent the matrix is transformed into an upper triangular matrix. Fictitious connecting branches (Fill In) are thereby produced. The number of additional connecting branches is dependent on the sequence of the individual transformation steps and on the degree of intermeshing VG. When constructing the upper triangular matrix, the sequence of the transformation steps is optimized. Therefore, there is a reduction in the dependence on the degree of intermeshing and the number of branches, as represented in FIG. 16. The number of fictitious branches influences the performance of the proposed method. The further diagrams for the individual program steps show this clearly.

Figure 17:
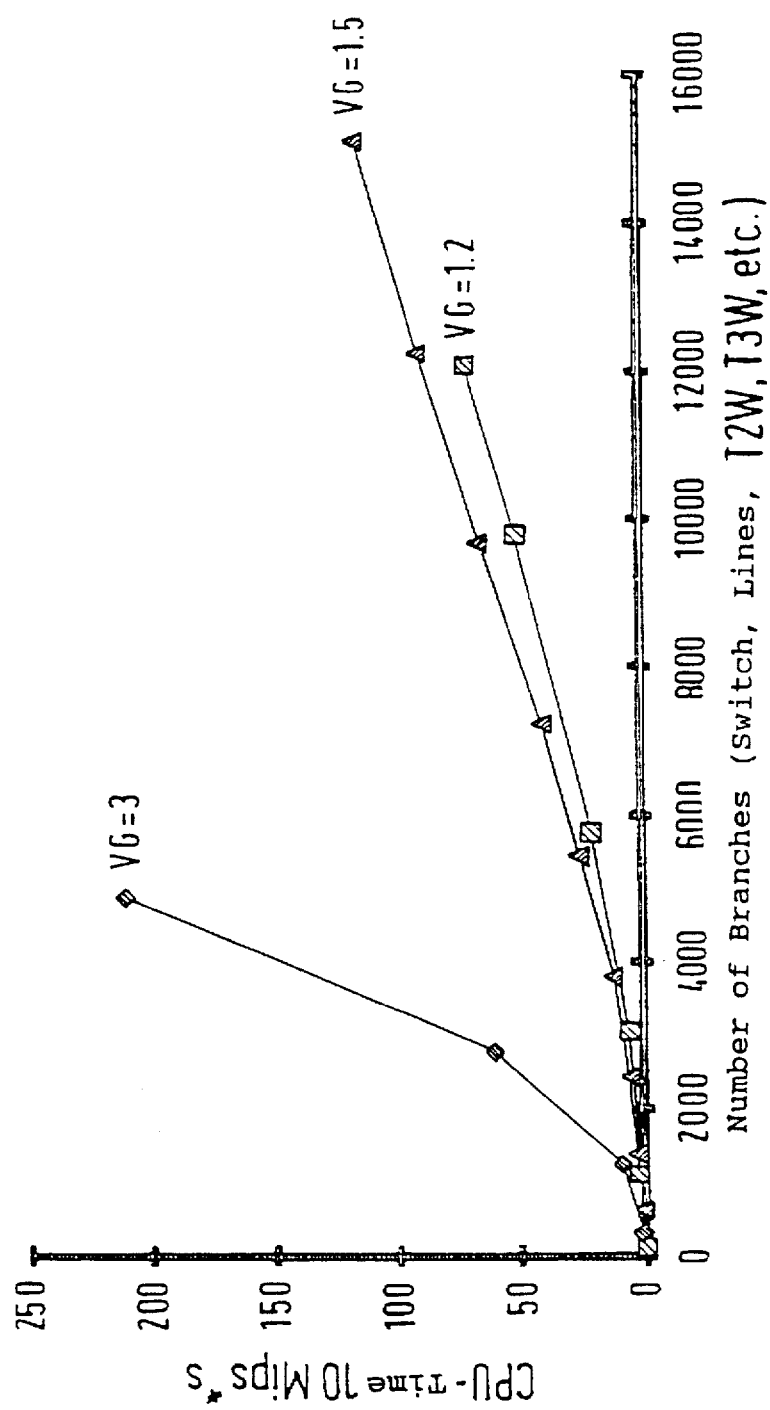
FIG. 17 is a diagram showing a CPU time for constructing a static topology (test example)

6.2 Performance of the individual program steps over the size of the network in dependence on the degree of intermeshing The CPU time of an 80486 40 MHz computer was measured for the following program steps in dependence on the number of branches and the degree of intermeshing 1. Constructing the Parquet [] static topology structure
2. Initializing the dynamic topology on the basis of the current status of all of the network branches
3. Updating the dynamic topology on account of a change in status of a branch FIG. 17 shows the required CPU time in 10 Mips*s for the construction of the Parquet [] static topology. The time for a 100 Mips CPU is then obtained through division by 100 Mips.

The constructing of this Parquet [] structure is the most involved of the three processing steps. However, it is only necessary to construct this structure in the case of network expansion. If a 200 Mips CPU (e.g. DEC AXP 600) is taken as a basis, about 3s CPU time is required for a network of a size similar to the test network described under item 5.

The size of the Parquet [] structure is calculated as follows:

(2* number of branches+number of terminals )*16 bytes

In the case of a network on the order of magnitude of the test network, the size of Parquet [] works out to about 0.6 Mbytes.

Figure 18:
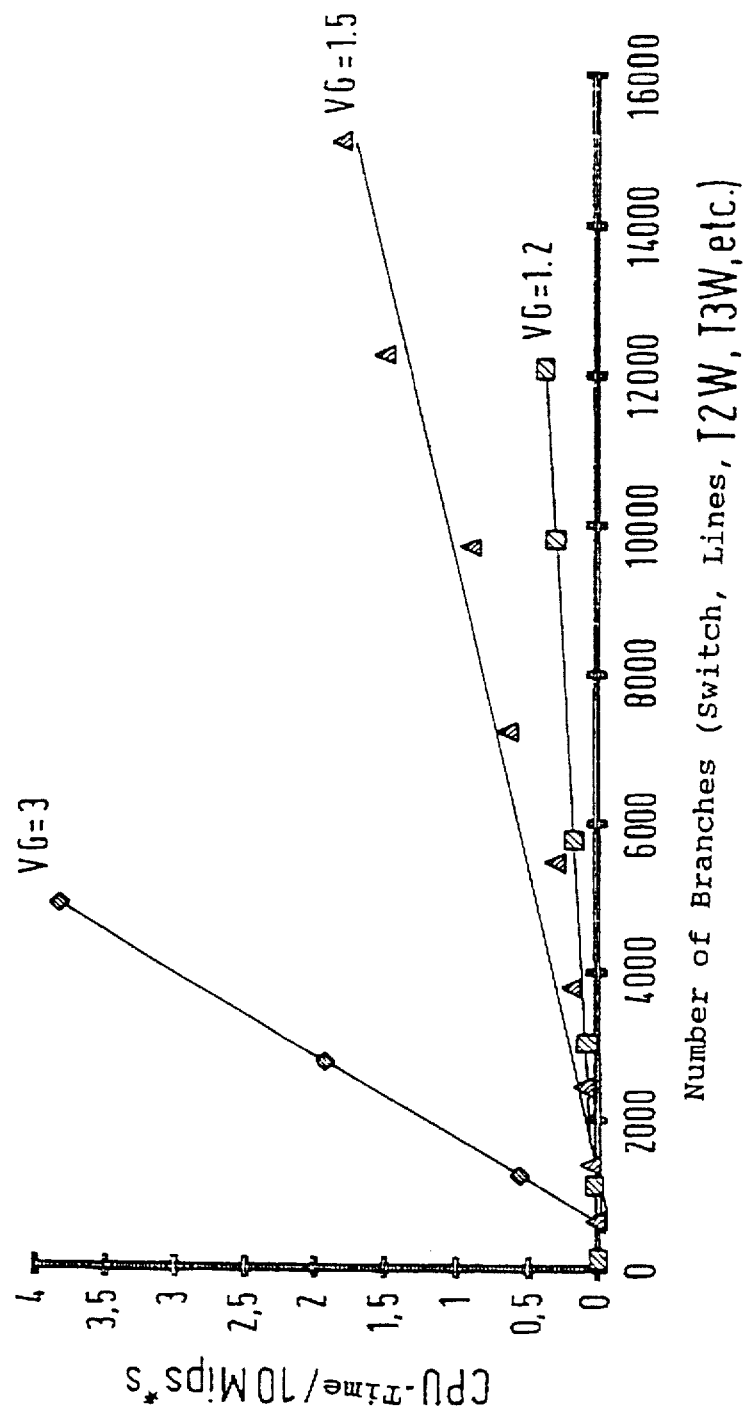
FIG. 18 is a diagram showing a CPU time for initializing the static topology (test example)

FIG. 18 shows the required CPU time in 10 Mips*s for the initialization of the Parquet [] static topology with the current status of all of the network branches:

An initialization of the topology is typically necessary during system startup, after data changes and, depending on the dual computer philosophy, during a computer change. In the case of a network on the order of magnitude of the test network, the initialization on a 200 Mips CPU would be completed in about 25 milliseconds of CPU time.

Figure 19:
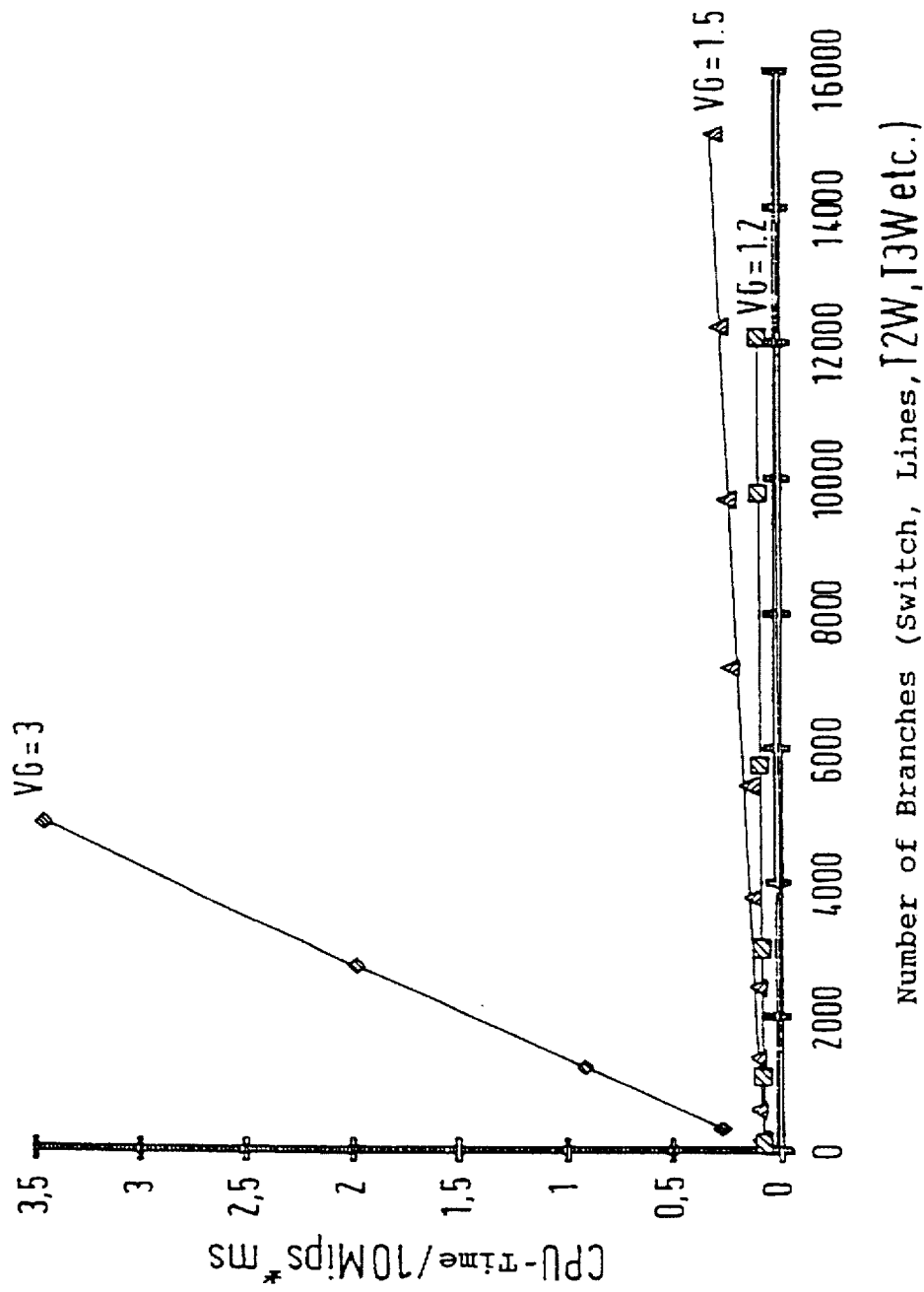
FIG. 19 is a diagram showing a CPU time for updating (test example).

FIG. 19 shows the required CPU time in 10 Mips*ms for the update of the Parquet [] topology with the current status of a network branch:

The average time for an update of the topology structure in the case of a change in status, e.g. of a switch, for a network on the order of magnitude of the test network for an 80486 CPU with 40 MHz is about $8 \cdot 010^5$ s. In the case of a 200 Mips CPU, it is on the order of magnitude of about $4.0 \cdot 10^{-6}$ s. This time is faster by several orders of magnitude than the times of the presently used and known methods. As a result, entirely new concepts in topology processing and in the subsequent calculation methods are possible. For example, all of the branches of the network can be investigated after every update to ascertain whether or not the respective branch is the only connection (critical branch) between two subnetworks. In the case of a network on the order of magnitude of the test network and a 200 Mips CPU, the total CPU time including update would last about 2*number of branches *$T_{update} \approx 100$ milliseconds Furthermore, this example shows that the cumulative CPU time for the execution of updates for all of the switches in this example amounts to about 50 milliseconds. This is only about twice the time which the initialization requires and is a further indication that, in the case of this method, the update includes only the really necessary changes of the data structure.

I claim:

1. A method for initializing and updating a network model of an electrical energy power network processed in a data processing system, which comprises:
   a) supplying a data processing system with static information in a form of topology data and dynamic data in a form of power and voltage measurement values as well as switch reports resulting in a network topology for illustrating a current network status in graph form and for latching purposes;
   b) forming the network topology in the form of a network graph by applying and extending sparse vector methods and sparse matrix methods;
   c) preparing captured network topology data of an electrical energy power network in the form of a terminal adjacence matrix and entering the network topology in the data processing system;
   d) transforming the terminal adjacence matrix into an upper triangular matrix, with additional fictitious connecting branches being produced;
   e) initializing the upper triangular matrix, with each element of the upper triangular matrix being initialized on a basis of an associated branch status; and
      e1) initializing each element belonging to a switched-on branch, with a negative integer constant K not being able to become greater than zero through further processing steps; and
      e2) initializing each element belonging to a switched-off or fictitious branch, with zero;
   f) forming matrix products for all rows i (i=1 up to a maximum number of rows) of the upper triangular matrix from and excluding a diagonal according to the following rule: if elements i, j and i, k are not equal to zero, incrementing elements of points of intersection of a row and column fraction of the upper triangular matrix by 1, with the elements j and k being loop indices for all of the elements of the row concerned;
   g) forming a path table from the upper triangular matrix, with the path table indicating an incident terminal index of a first element of a row differing from zero, for each row or each terminal of the upper triangular matrix;
   h) updating the upper triangular matrix in the case of a change of the captured network topology data, being a change in status of a network branch, by the following measures:
      h1) in the case of switching off a network branch:subtracting the constant K from the corresponding current (=previous) value of the matrix element;
         h1.1) if this element becomes zero as a result, decrementing by 1 the elements of all of the points of intersection of the upper triangular matrix of this row and column element with all of the other elements not equal to zero of the associated row or column, to the right of or beneath the diagonal;
         repeating the step h1.1) for further elements if they become zero as a result;

h2) in the case of switching on a network branch: adding the constant K to the current value of the matrix element;

h2.1) if this element becomes K or, for further repetitions, becomes 1 as a result, incrementing by 1 the elements of all of the points of intersection of the upper triangular matrix of this row and column element with all of the other elements not equal to zero of the associated row or column, to the right of or beneath the diagonal;

repeating the step h2.1) for elements if they become 1 as a result;

i) updating the path table in accordance with step g);

j) identifying components of the network graph using the path table, with the first terminal index of the table being taken as a basis for assigning the same component identification to all of the terminals of an associated subpath; if an already allocated identification occurs when running through further subpaths (due to encountering a component which has already been assigned an identification), assigning the identification to the subpath being run through at that time; and breaking down the network graph into subgraphs in a manner corresponding to the number of the identifications allocated for assisting in trouble shooting the electrical energy power network.

2. A method for initializing and updating a network model of an electrical energy power network processed in a data processing system, which comprises:

a) supplying a data processing system with static information in a form of topology data and dynamic data in a form of power and voltage measurement values as well as switch reports resulting in a network topology for illustrating a current network status in graph form and for latching purposes;

b) forming the network topology in the form of a network graph by applying and extending sparse vector methods and sparse matrix methods;

c) preparing captured network topology data of an electrical energy power network in the form of a terminal adjacence matrix and entering the network topology in the data processing system;

d) transforming the terminal adjacence matrix into an upper triangular matrix, with additional fictitious connecting branches being produced;

e) initializing the upper triangular matrix, with each element of the upper triangular matrix being initialized on a basis of an associated branch status; and e1) initializing each element belonging to a switched-on branch, with a positive integer constant K not being able to become less than zero through further processing steps; and e2) initializing each element belonging to a switched-off or fictitious branch, with zero;

f) forming matrix products for all rows i (i=1 up to a maximum number of rows) of the upper triangular matrix from and excluding a diagonal according to the following rule: if elements i, j and i, k are not equal to zero, decrementing elements of points of intersection of a row and column fraction of the upper triangular matrix by 1, with the elements j and k being loop indices for all of the elements of the row concerned;

g) forming a path table from the upper triangular matrix, with the path table indicating an incident terminal index of a first element of a row differing from zero, for each row or each terminal of the upper triangular matrix;

h) updating the upper triangular matrix in the case of change of the captured network topology data, being change in status of a network branch, by the following measures:

h1) in the case of switching off a network branch: subtracting the constant K from the corresponding current (=previous) value of the matrix element;

h1.1) if this element becomes zero as a result, incrementing by 1 the elements of all of the points of intersection of the upper triangular matrix of this row and column element with all of the other elements not equal to zero of the associated row or column, to the right of or beneath the diagonal;

repeating the step h1.1) for further elements if they become zero as a result;

h2) in the case of switching on a network branch: adding the constant K to the current value of the matrix element;

h2.1) if this element becomes K or, for further repetitions, becomes 1 as a result, decrementing by 1 the elements of all of the points of intersection of the upper triangular matrix of this row and column element with all of the other elements not equal to zero of the associated row or column, to the right of or beneath the diagonal;

repeating the step h2.1) for elements if they become 1 as a result;

i) updating the path table in accordance with step g);

j) identifying components of the network graph using the path table, with the first terminal index of the table being taken as a basis for assigning the same component identification to all of the terminals of an associated subpath; if an already allocated identification occurs when running through further subpaths (due to encountering a component which has already been assigned an identification), assigning the identification to the subpath being run through at that time; and breaking down the network graph into subgraphs in a manner corresponding to the number of the identifications allocated for assisting in trouble shooting the electrical energy power network.

3. The method according to claim 1, which comprises using internal and external topological addresses for preparing the network topology data in a data structure, with a defined topological hierarchy being taken as a basis for designating each hierarchical stage with an identifier, placing the association with certain components of the higher hierarchical stages in an external topological address of a terminal (lowest hierarchical stage), and deriving abstract end points of the network graph from that association as internal topological addresses.

4. The method according to claim 3, which comprises:
   topologically assigning power measurement values, voltage measurement values and protection signals; and
   modelling the power measurement values as oriented impedanceless branches and modelling the voltage measurement values as objects with an external topological address.

* * * * *